(12) United States Patent
Anderson et al.

(10) Patent No.: US 7,842,568 B2
(45) Date of Patent: Nov. 30, 2010

(54) LATERAL POWER SEMICONDUCTOR DEVICE FOR HIGH FREQUENCY POWER CONVERSION SYSTEM, HAS ISOLATION LAYER FORMED OVER SUBSTRATE FOR REDUCING MINORITY CARRIER STORAGE IN SUBSTRATE

(75) Inventors: Samuel J. Anderson, Tempe, AZ (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 69 days.

(21) Appl. No.: 11/770,258

(22) Filed: Jun. 28, 2007

(65) Prior Publication Data

US 2008/0042196 A1 Feb. 21, 2008

Related U.S. Application Data

(60) Provisional application No. 60/806,018, filed on Jun. 28, 2006.

(51) Int. Cl.
*H01L 21/00* (2006.01)
*H01L 21/84* (2006.01)
*H01L 21/8234* (2006.01)
*H01L 29/78* (2006.01)
*H01L 29/30* (2006.01)

(52) U.S. Cl. ............... 438/237; 438/155; 257/E29.261; 257/E29.106; 257/229; 257/231; 257/350

(58) Field of Classification Search .......... 257/E29.261, 257/E29.106, 350, 229, 231; 323/229, 231; 438/155, 237
See application file for complete search history.

(56) References Cited

U.S. PATENT DOCUMENTS

| 5,420,451 | A | 5/1995 | Williams et al. |
| 5,574,295 | A | 11/1996 | Kurtz et al. |
| 5,801,420 | A | 9/1998 | Fujishima |
| 6,150,200 | A | 11/2000 | Merchant |
| 6,734,524 | B1 * | 5/2004 | Parthasarathy et al. ...... 257/510 |
| 2004/0087065 | A1 | 5/2004 | Udrea et al. |
| 2006/0113592 | A1 * | 6/2006 | Pendharkar et al. ......... 257/335 |

* cited by examiner

*Primary Examiner*—Phat X Cao
*Assistant Examiner*—Diana C Garrity
(74) *Attorney, Agent, or Firm*—Robert D. Atkins

(57) ABSTRACT

A lateral power semiconductor device has a substrate and an isolation layer formed over the substrate for reducing minority carrier storage in the substrate. A well region is formed over the isolation layer. A source region, drain region, and channel region are formed in the well. A first region is formed on a surface of the lateral power semiconductor device adjacent to the source region. The lateral power semiconductor device has a body diode between the first region and drain region. The isolation layer confines the minority carrier charge from the body diode to a depth of less than 20 μm from the surface of the lateral power semiconductor device. In one embodiment, the isolation layer is a buried oxide layer and the substrate is an n-type or p-type handle wafer. Alternatively, the isolation layer is an epitaxial layer and the substrate is made with N+ or P+ semiconductor material.

9 Claims, 6 Drawing Sheets

LATERAL POWER SEMICONDUCTOR DEVICE FOR HIGH FREQUENCY POWER CONVERSION SYSTEM, HAS ISOLATION LAYER FORMED OVER SUBSTRATE FOR REDUCING MINORITY CARRIER STORAGE IN SUBSTRATE

CLAIM TO DOMESTIC PRIORITY

The present non-provisional patent application claims priority to provisional application Ser. No. 60/806,018, entitled "Method to Reduce Body Diode Reverse Recovery Time of Lateral Power Semiconductor Devices," filed on Jun. 28, 2006.

FIELD OF THE INVENTION

The present invention relates in general to electronic circuits and semiconductor devices and, more particularly, to a circuit and method of reducing body diode reverse recovery time in lateral power semiconductor devices.

BACKGROUND OF THE INVENTION

Power semiconductor devices, such as power MOSFETs are commonly used in high frequency switching power conversion systems. In many applications the body diode of the power MOSFET is alternately biased between conduction and blocking states. During forward bias of the body diode, charge is stored in the neutral regions adjacent to the PN junction.

Before the body diode can return to a blocking state, the charge stored in the neutral regions adjacent to the PN junction must be extracted or neutralized. The process of extracting or neutralizing charge is known as "reverse recovery."

The extraction and neutralization of body diode charge can result in power loss which lowers the power conversion efficiency of the semiconductor device. Therefore, it is advantageous if the total charge reverse recovery charge ($Q_{rr}$) and the characteristic time necessary to extract or neutralize the charge ($t_{rr}$) are minimized. In prior art embodiments, an external Schottky diode is placed in parallel with the semiconductor device to minimize recovery losses. Since the Schottky diode has a lower forward voltage drop than the PN diode, the inductor current flows primarily through the Schottky diode, which has fast recovery characteristics. However, the placement of the Schottky diode results in increased circuit costs. Additionally, the placement of the Schottky diode requires additional board space.

Accordingly, a need exists to minimize the body diode reverse recovery time in semiconductor devices to reduce power loss and promote power conversion efficiency in the semiconductor device.

SUMMARY OF THE INVENTION

In one embodiment, the present invention is a lateral power semiconductor device comprising a substrate and an isolation layer formed over the substrate for reducing minority carrier storage in the substrate. A well region has a first conductivity type and is formed in the isolation layer. A source region has a second conductivity type and is formed in the well region. A drain region has the second conductivity type and is formed in the well region. A channel region has the first conductivity type and is formed in the well between the source and drain regions.

In another embodiment, the present invention is a method of manufacturing a lateral power semiconductor device comprising the steps of forming a substrate, forming an oxide layer over the substrate for reducing minority carrier storage in the substrate, forming a silicon layer over the oxide layer, forming a well region in the silicon layer, and forming a source region, drain region, and channel region of the lateral power semiconductor device in the well, the source region and drain region having a first conductivity type, the channel region and well region having a second conductivity type.

In another embodiment, the present invention is a method of manufacturing a lateral power semiconductor device comprising the steps of forming a substrate, forming an epitaxial layer over the substrate for reducing minority carrier storage in the substrate, forming a well region in the epitaxial layer, and forming a source region, drain region, and channel region of the lateral power semiconductor device in the well, the source region and drain region having a first conductivity type, the channel region and well region having a second conductivity type.

In another embodiment, the present invention is a method of manufacturing a lateral power semiconductor device comprising the steps of forming a substrate, forming an isolation layer over the substrate for reducing minority carrier storage in the substrate, forming a well region in the isolation layer, and forming a source region, drain region, and channel region of the lateral power semiconductor device in the well, the source region and drain region having a first conductivity type, the channel region and well region having a second conductivity type.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
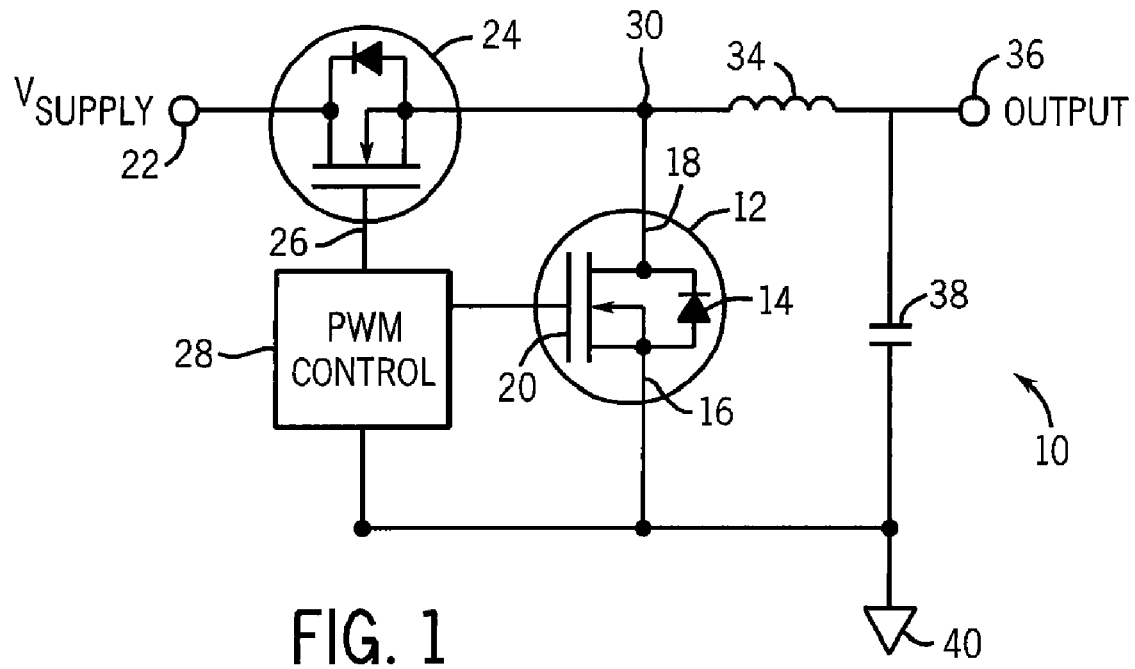
FIG. 1 illustrates an example embodiment of a high-frequency power conversion system having a semiconductor device which includes a body diode.

Turning to FIG. 1, an example of a high-frequency power conversion system 10 is depicted. The example shows a high-frequency synchronous buck regulator 10. Regulator 10 includes a first semiconductor device or power Metal-on-Silicon Field Effect Transistor (MOSFET) 12. MOSFET 12 includes a body diode 14, source 16, drain 18, and gate 20. Regulator 10 has a power source such as Vsupply 22 which is coupled to a second semiconductor device or power MOSFET 24. MOSFET 24 is electrically connected via node 26 to pulse-width-modulator (PWM) control device 28.

PWM 28 provides control signals to MOSFET 24 and MOSFET 12 as depicted. MOSFET 12 is connected between node 30 and ground terminal 40. An inductor 34 is connected between node 30 and output 36. A capacitor 38 is connected between output 36 and ground terminal 40.

In normal operation, body diode 14 of MOSFET 12 is momentarily forward-biased at the switching frequency, which results in power loss and a reduction in power conversion efficiency, as will be now described in an example operation of regulator 10. As a first step in the example operation, MOSFET 24 is switched to an "on" state, and MOSFET 12 is switched to an "off" state. Electrical energy is stored in inductor 34 and capacitor 38 and delivered to output 36 to develop an output voltage for regulator 10. As a next step in the operation, MOSFET 24 is switched off while MOSFET 12 remains off. The time period when MOSFET 12 and MOSFET 24 are both off is commonly known as "dead time." During the dead time, the inductor current flows through body diode 14 and stores charge in the diode.

As a next step in the operation, MOSFET 24 remains off while MOSFET 12 is switched on. The inductor current flows from source 16 to drain 18 of MOSFET 12. As a next step in the operation, MOSFET 12 is switched off, while MOSFET 24 is switched on, returning regulator 10 to the initial state of regulator 10 when the example operation began. As a result, MOSFET 12 conducts current until the charge stored in body diode 14 is extracted or neutralized. The current flowing through MOSFET 12 does not charge inductor 34, capacitor 38, or flow to output 36. The resulting lack of productive use of the current amounts to power loss, which reduces the power conversion efficiency of the synchronous buck regulator 10.

Figure 2:
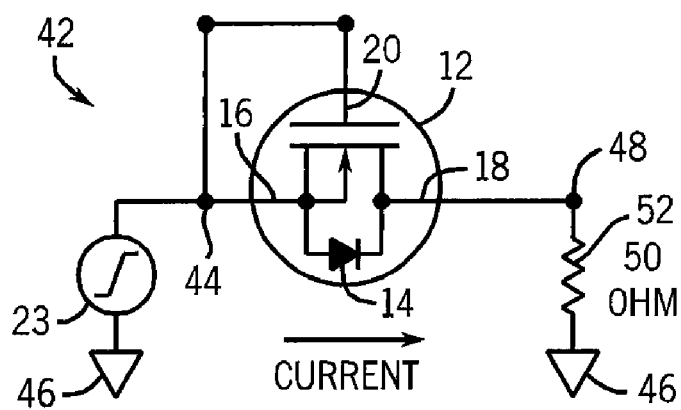
FIG. 2 illustrates an example test circuit to simulate body diode reverse recovery measurements.

Turning to FIG. 2, an example test circuit 42 to simulate MOSFET 12 and body diode 14 reverse recovery measurements is depicted. A power source 23 is shown coupled between node 44 and ground terminal 46. Source 16 is shown connected to node 44, as is gate 20. Drain 18 is connected to one side of resistor 52 at node 48, here depicted to be 50 Ohms. The other side of resistor 50 is coupled to ground terminal 46.

To obtain reverse recovery measurements, MOSFET 12 is biased into the off state and body diode 14 is first biased to a specified forward current. Body diode 14 is then commutated by biasing the diode such that the forward current is reduced at a specified rate, dI/dt.

Figure 3:
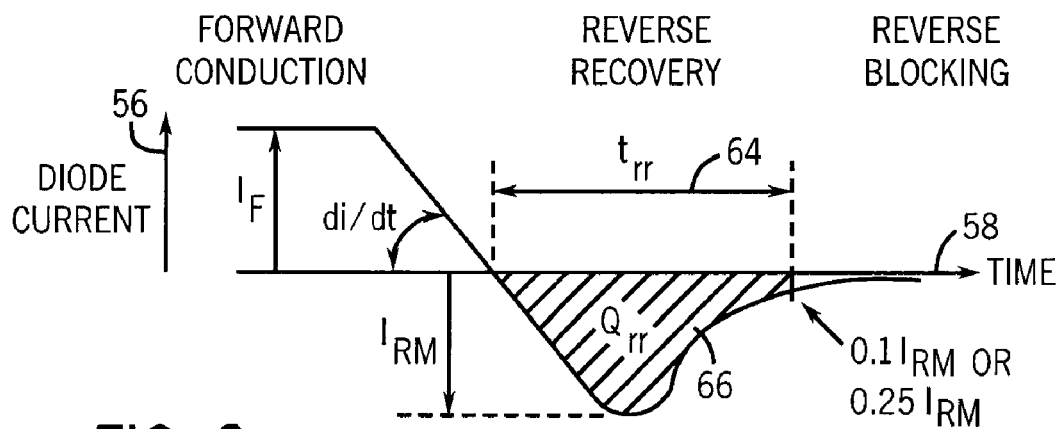
FIG. 3 illustrates a typical reverse recovery waveform.

FIG. 3 shows a typical reverse recovery waveform of body diode 14. The diode current 56 is shown on the y-axis, and time 58 is shown on the x-axis. Three periods of operation are shown. The first, a forward conduction period, refers to the forward bias of diode 14 where charge is stored in the neutral regions adjacent to the PN junction. The forward current is then reduced at a rate of dI/dt to a point where $I_{RM}$ is approximately equal to the beginning magnitude $I_F$. The current is extracted or neutralized through the rest of the reverse recovery period 64, denoted as $t_{rr}$. The area under the curve, or total charge reverse recovery charge 66, is denoted as $Q_{rr}$. Body diode 14 returns to a blocking state in the reverse blocking period.

Figure 4:
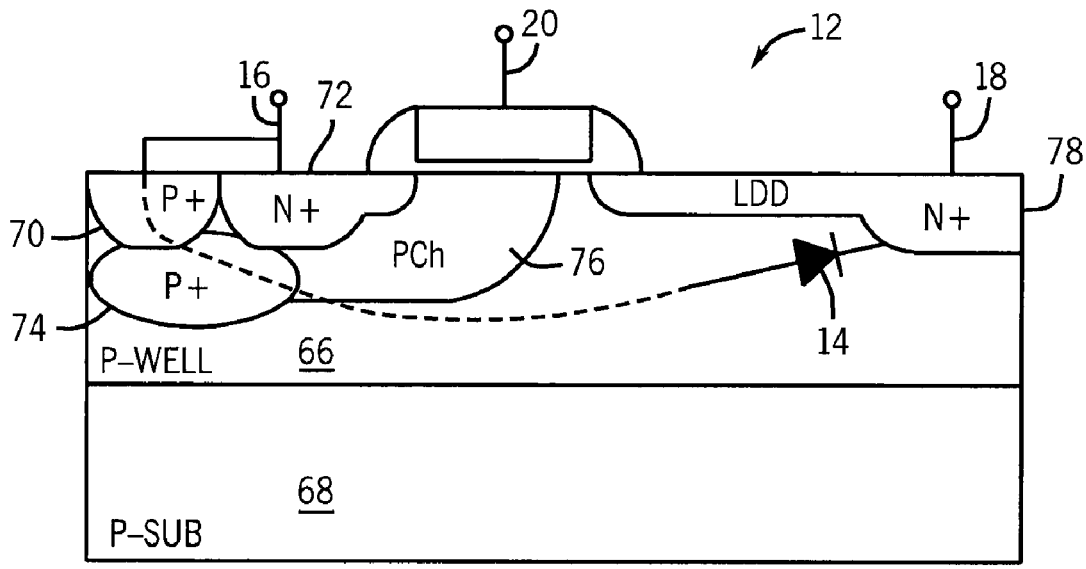
FIG. 4 illustrates a first unit cell cross-section of a lateral power MOSFET having a body diode.

FIG. 4 shows a typical unit cell cross-sectional view of lateral power MOSFET 12 with body diode 14. Again, source 16, drain 18, and gate 20 regions are depicted. P-well 66 is formed over P-type substrate 68. P-well 66 includes first P+ region 70 and N+ source region 72. Below first P+ region 70 is a second P+ region 74, adjacent to P channel region 76. P+ region 70 and P+ region 74 are adjacent to N+ source region 72. An N+ drain region 78 with lightly doped drain (LDD) is disposed under drain contact 18.

Body diode 14, when forward biased, stores excess minority carrier charge. Much of the excess minority carrier charge is found throughout P-type substrate 68. When a circuit employing MOSFET 12 commutates body diode 14, the stored charge must be extracted or neutralized for the diode to be in the off state. The excess minority carriers must diffuse to the surface to be extracted or recombine in substrate 68 to be neutralized. The depth of the stored minority carrier charge and long minority carrier lifetime of substrate 68 serves to increase recovery time $t_{rr}$ and total charge reverse recovery charge $Q_{rr}$. As a result, the lateral power MOSFET device shown in FIG. 4 has slow reverse recovery characteristics due to large excess minority charge storage extending deep into the substrate.

The reverse recovery characteristics of MOSFET 12 can be improved by confining the minority carrier charge to a thin surface silicon region, e.g., 20 µm or less. Confining the charge storage to the vicinity of the PN junction of body diode 14 reduces the distance the charge needs to diffuse before being extracted. Furthermore, minority carrier lifetime reduction can be locally controlled by creating regions of damage, thereby introducing electron and hole traps. A short minority carrier lifetime reduces the time required to neutralize the excess minority carrier charge, thereby reducing recovery time $t_{rr}$ and total charge reverse recovery charge $Q_{rr}$.

Figure 5:
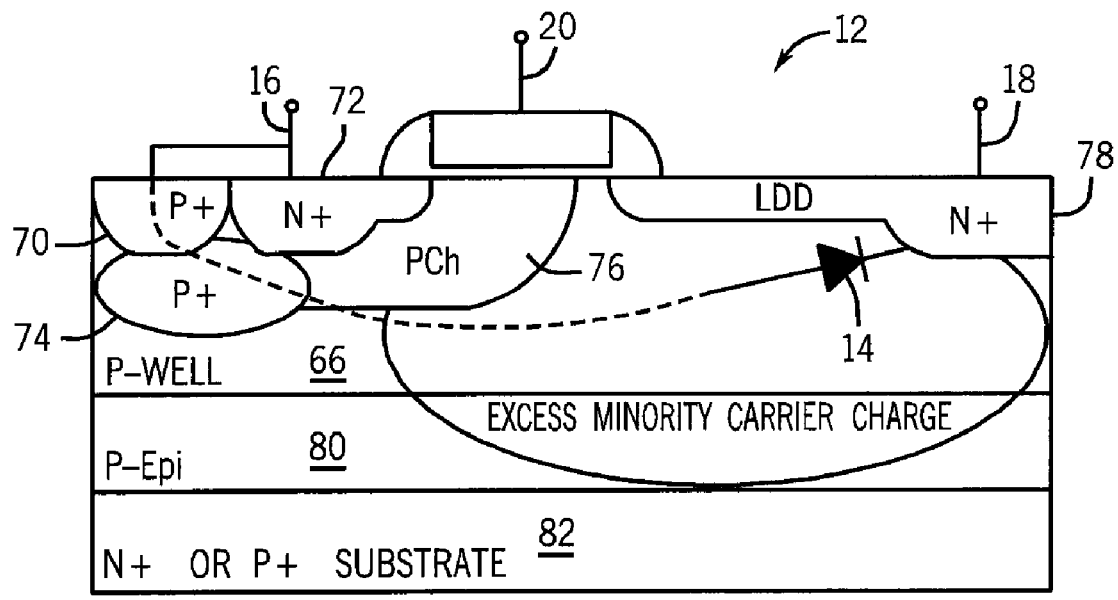
FIG. 5 illustrates a unit cell cross-section of a second embodiment of a lateral power MOSFET having a body diode.

Two methods can improve the reverse recovery characteristics of lateral power semiconductor devices such as MOSFET 12. Each method involves forming an isolation layer over the substrate and forming the p-well in the isolation layer to reduce minority carrier build-up in the substrate. The first method is depicted in FIG. 5, and involves utilizing a P-type epitaxial layer (P-epi) which is disposed over an N+ or P+ substrate. FIG. 5 depicts P-well layer 66 including regions 70, 72, 74, 76, and 78 as depicted in FIG. 4. P-well region 66 is formed in P-epi layer 80. An N+ or P+ substrate 82 is shown disposed below P-epi layer 80.

The junction between P-epi layer 80 and N+/P+ substrate 82 retards minority carrier diffusion into N+/P+ substrate 82. The minority carrier stored charge in substrate 82 is thus reduced. The charge is confined near the PN junction of body diode 14. The heavily doped N+/P+ substrate 82 has a short minority carrier lifetime, which quickens charge neutralization. As a result, recovery time $t_{rr}$ and total charge reverse recovery charge $Q_{rr}$ is reduced.

Figure 6:
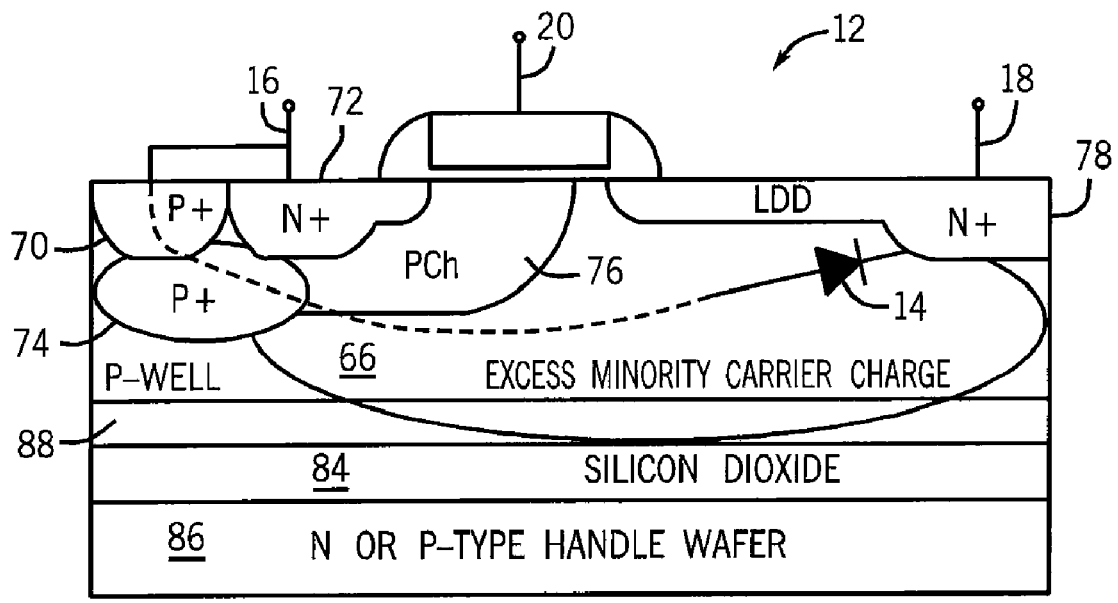
FIG. 6 illustrates a unit cell cross-section of a third embodiment of a lateral power MOSFET having a body diode.

FIG. 6 illustrates a second method to improve reverse recovery characteristics of lateral power semiconductor devices such as MOSFET 12 which utilizes a silicon-on-insulator (SOI) substrate. A unit cell cross-sectional view of lateral power MOSFET 12 with body diode 14 is depicted with P-well region 66 and regions 70, 72, 74, 76, and 78. Silicon dioxide ($SiO_2$) layer or buried-oxide (BOX) layer 84 acts as an insulator. Device or silicon layer 88 is formed over BOX layer 84. P-well region 66 is formed in the silicon layer 88. The insulating BOX layer is formed by directly bonding oxidized silicon (handle) with a second substrate. The majority of the second substrate is subsequently removed; however, the remnants of the second substrate make up the topmost device or silicon layer. Hence, p-well region 66 is considered part of device layer 88. An N or P-type handle wafer 86 is shown disposed below layer 84 to provide structural and mechanical support for layers 66 and 84.

Since oxide layer 84 confines excess charge to the vicinity of the PN junction of body diode 14, minority carrier stored charge in substrate 84 is reduced. By confining excess charge to body diode 14, the distance that the charge must diffuse to be extracted is reduced. The reduction in minority carrier stored charge and confining of excess charge to body diode 14 reduces recovery time $t_{rr}$ and total charge reverse recovery charge $Q_{rr}$.

Enhanced damage at BOX layer 84 and silicon interface creates electron and hole traps. The electron and hole traps serve to decrease minority carrier lifetime. The reduction in minority carrier lifetime reduces the time for charge neutralization, thus further reducing recovery time $t_{rr}$ and total charge reverse recovery charge $Q_{rr}$.

To simulate the effects on reverse recovery characteristics using a P-epi layer and using a SOI substrate, three example structures are described. Each semiconductor device simulated includes first P+ region 70, N+ source region 72, second P+ region 74, P channel region 76, and N+ drain region 78 with LDD as previously described. The baseline device has 300 μm, 10.5 Ω*cm P-type bulk silicon comparable to the unit cross-sectional view shown in FIG. 4. MOSFET 12 with P-epi region 80 (P-epi device) has 10 μm, 10.5 Ω*cm P-epi on 290 μm P+ substrate comparable to the unit cross-sectional view shown in FIG. 5. Finally, MOSFET 12 with BOX layer 84 (SOI device) has 10 μm, 10.5 Ω*cm P—Si on 4 μm oxide on 286 μm P+ substrate comparable to the unit cross-sectional view shown in FIG. 6.

Figure 7:
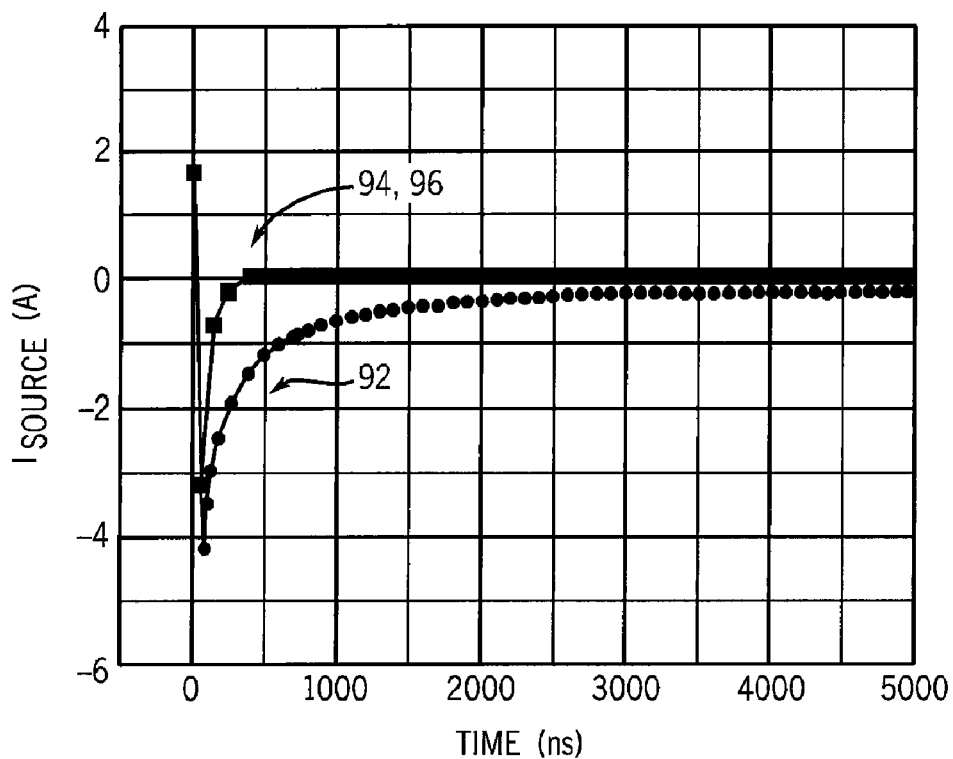
FIG. 7 illustrates reverse recovery waveforms including a baseline waveform and two embodiments according to the present invention.

Turning to FIG. 7, resulting reverse recovery waveforms from simulations run on the example structures, including the baseline device, P-epi device and SOI device, is shown. Current from a power source is depicted on the Y-axis as measured in amperes (A). Time is depicted on the X-axis as measured in nanoseconds (ns). At time zero, the baseline, p-epi, and SOI devices exhibit the same forward current measurement. A few nanoseconds into the simulation, the devices begin the reverse recovery process. The baseline device is depicted in line 92. As shown, baseline device has the largest reverse current, e.g., greater than −4 amperes, reaching the minimum at a point several nanoseconds beyond the P-epi and SOI devices depicted in lines 94 and 96. Moreover, at approximately 400 ns, the baseline structure demonstrates that the device is not yet halfway through the recovery process. The P-epi and SOI devices, however, have essentially finished the recovery process and have entered the reverse blocking time period previously described. The P-epi and SOI devices essentially show the same effect and improvement over the baseline device.

Figure 8:
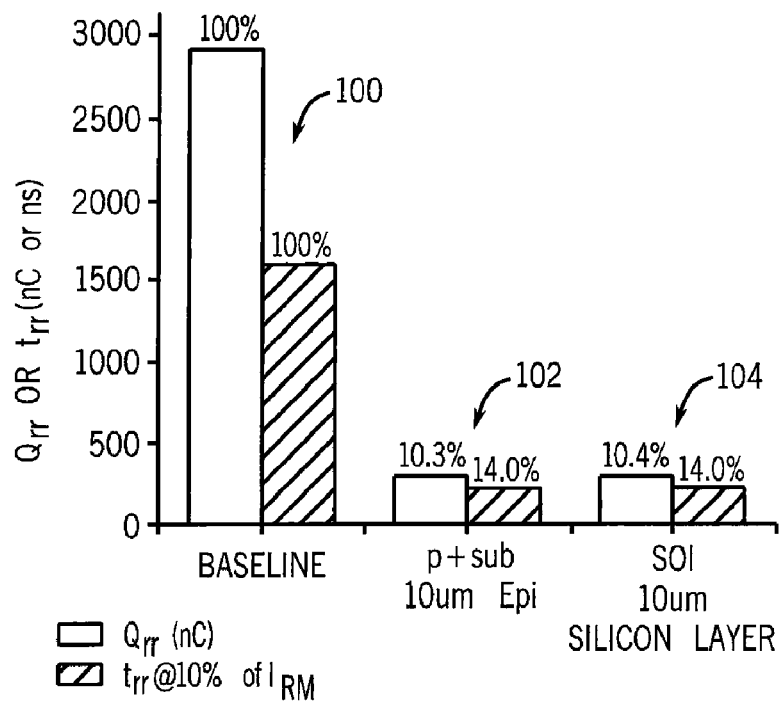
FIG. 8 illustrates total charge reverse recovery charge in a baseline semiconductor device and two embodiments according to the present invention.

FIG. 8 depicts the baseline, P-epi and SOI devices as a percentage of recovery time $t_{rr}$ and total charge reverse recovery charge $Q_{rr}$, which is shown on the Y-axis in terms of nanoCoulombs (nC) for charge and nanoseconds (ns) for time, respectively. Again, the data obtained in FIG. 8 results from simulations of the devices previously described. As would be expected, the baseline device is presented in terms of 100 percent as measured in reverse recovery charge and recovery time by graph 100. P-epi device demonstrates an improvement, showing 10.3 percent of the reverse recovery charge of the baseline device, and 14 percent of the recovery time in graph 102. The SOI device demonstrates generally the same improvement, showing 10.4 percent of the reverse recovery charge and again 14 percent of the recovery time in graph 104. In total, the P-epi and SOI devices exhibit approximate 90 percent reduction in total recovery charge and 86 percent reduction in recovery time.

Figure 9:
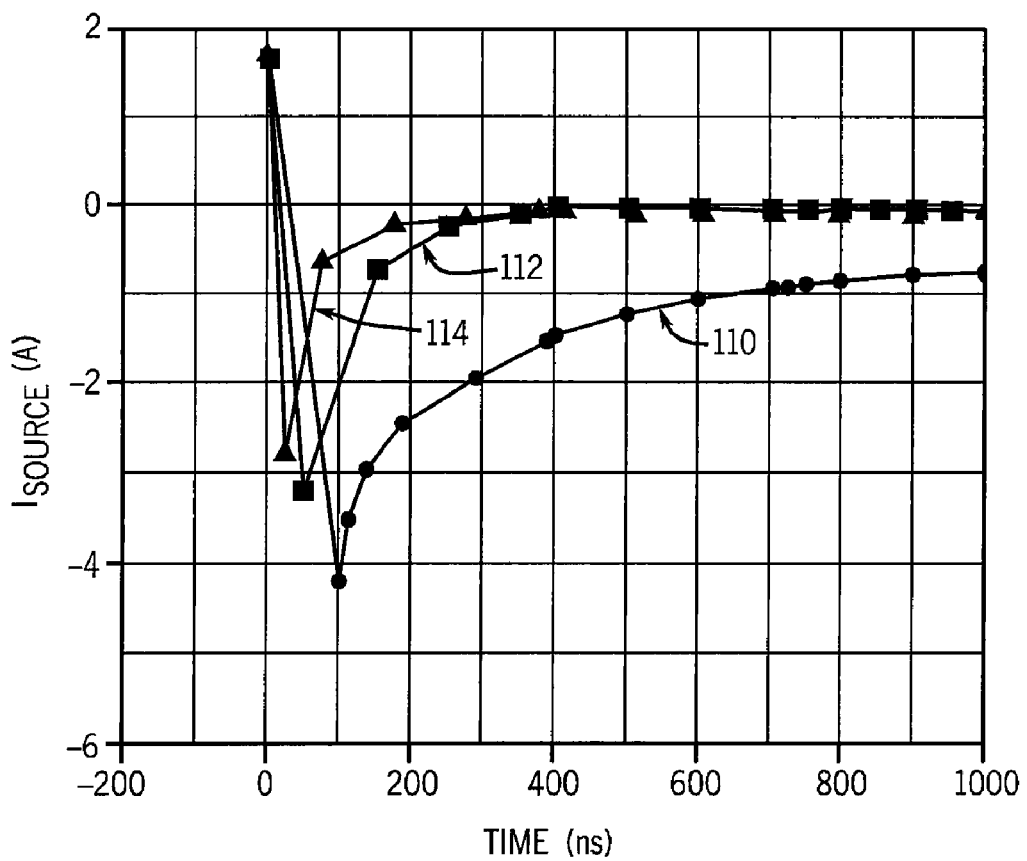
FIG. 9 illustrates reverse recovery waveforms including a baseline waveform and two embodiments according to the present invention, the two embodiments having varying thickness active layers.

FIG. 9 again depicts simulation data of the devices. Again, source current is shown along the Y-axis as measured in amperes. Time is shown along the X-axis as measured in nanoseconds. Line 110 depicts the baseline device data, which again demonstrates the largest reverse current and longest recovery period. Line 112 demonstrates the improvement seen in both the P-epi and SOI devices using a 10 μm thick active layer. Line 114 demonstrates the improvement seen in both the P-epi and SOI devices using a 6 μm thick active layer. The thinnest active layer results in the greatest improvement, reducing reverse current by approximately 1 ampere and reducing recovery time by tens of nanoseconds.

Figure 10:
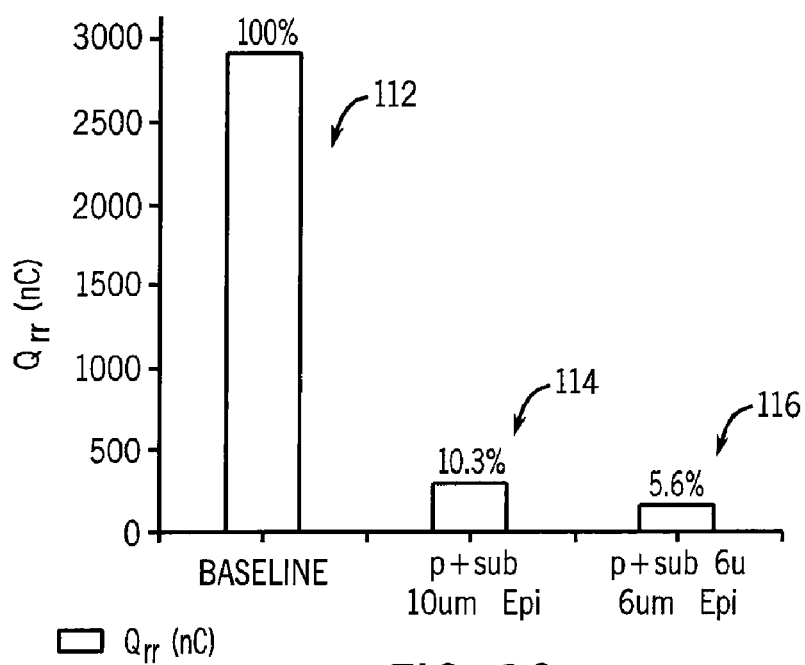
FIG. 10 illustrates total charge reverse recovery charge in a baseline semiconductor device and two embodiments according to the present invention, the two embodiments having varying thickness active layers.

FIG. 10 illustrates varying active layer thicknesses as a percentage basis of reduced total charge reverse recovery charge $Q_{rr}$. The reverse recovery charge is again measured in nC along the Y-axis. Again, the baseline device is depicted at 100 percent in graph 112. Graph 114 shows a P-epi device having a 10 μm epitaxial active layer. Graph 114 demonstrates an approximate 90 percent reduction in reverse recovery charge. Graph 116 shows a P-epi device having a 6 μm epitaxial active layer shows additional improvement, with a greater than 94 percent decrease in reverse recovery charge.

Figure 11:
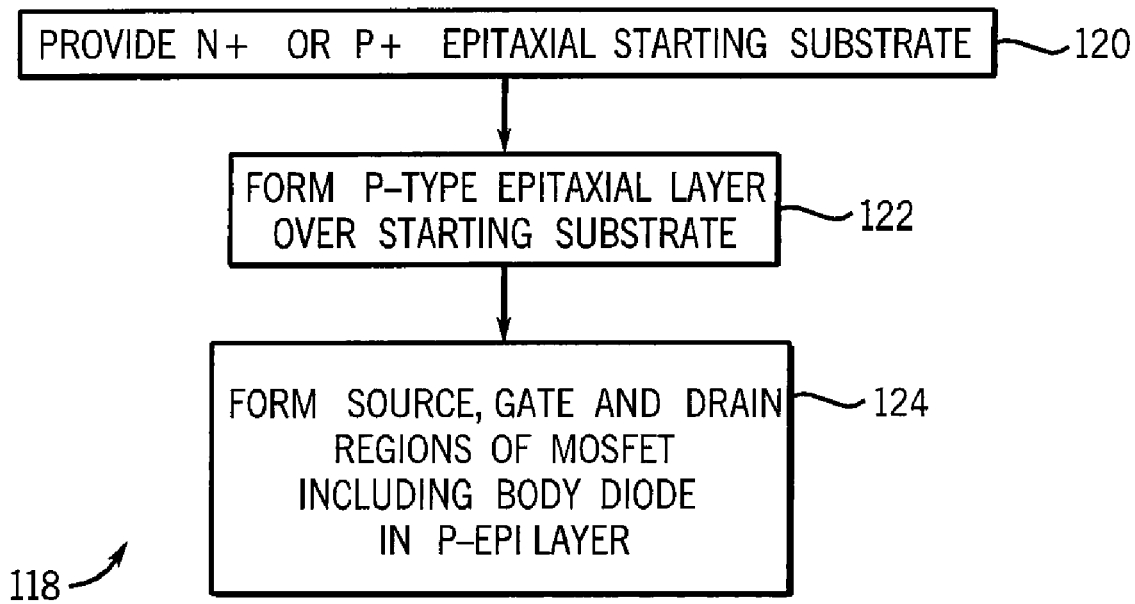
FIG. 11 illustrates a first example method of manufacturing a semiconductor device having reduced total charge recovery charge characteristics.

Turning to FIG. 11, an example method 118 of manufacturing a semiconductor device 12 such as a lateral power semiconductor device having reduced total charge reverse recovery charge is depicted. The semiconductor device 12 utilizes the P-epi method as previously described. An N+ or P+ epitaxial starting substrate is first provided in step 120. A P-type epitaxial layer is formed over the starting substrate in step 122. The source, gate, and drain regions of device 12, including body diode 14, are formed in step 124.

Figure 12:
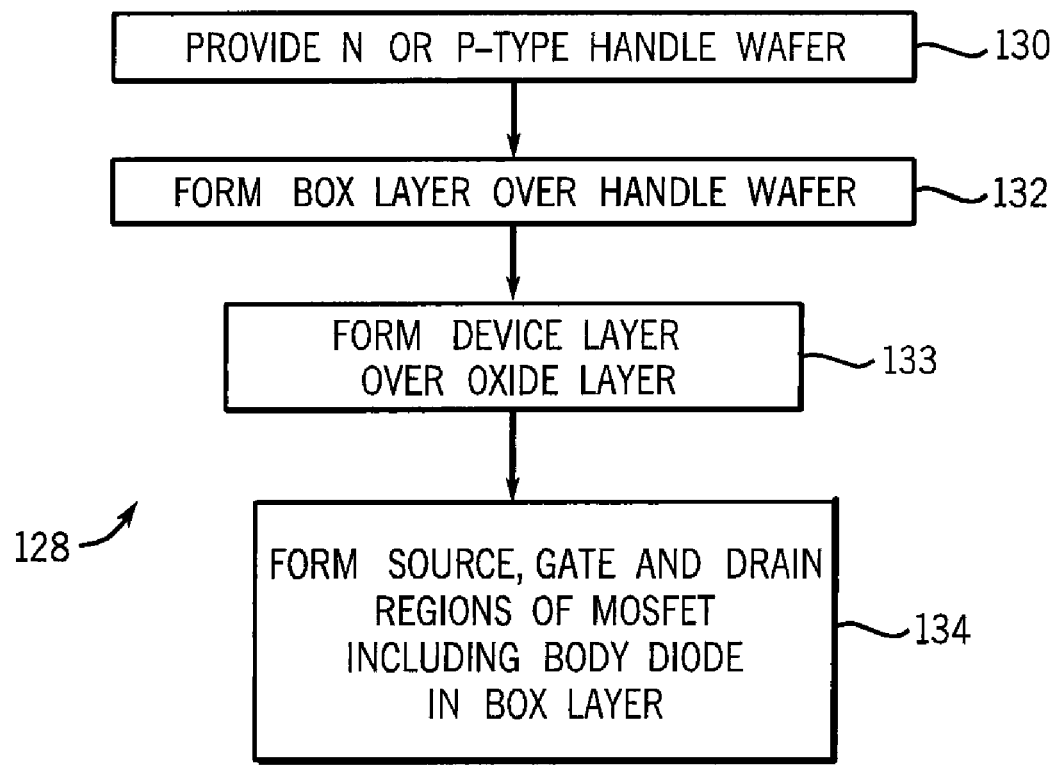
FIG. 12 illustrates a second example method of manufacturing a semiconductor device having reduced total charge recovery charge characteristics.

FIG. 12 depicts a second example method 128 of manufacturing a semiconductor device 12 having reduced total charge reverse recovery charge utilizing a SOI method as previously described. An N or P type handle wafer is provided for mechanical support in step 130. A BOX or oxide layer is formed over the handle wafer in step 132. A device layer is formed over the oxide layer in step 133. The source, gate, and drain regions of device 12, including body diode 14, are formed in step 134. Methods 118 and 128 can make use of manufacturing techniques for MOS-type devices 12.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of manufacturing a lateral power semiconductor device, consisting of:
providing a substrate;
forming an oxide layer over the substrate for reducing minority carrier storage in the substrate;

forming a silicon layer having a first conductivity type directly on the oxide layer;

forming a well region having the first conductivity type in the silicon layer;

forming a source region having a second conductivity type, drain region having the second conductivity type, gate region, and channel region having the first conductivity type in the well region, the channel region being disposed below the gate region between the source region and drain region;

forming a first region having the first conductivity type on a surface of the lateral power semiconductor device adjacent to the source region, wherein a body diode is formed between the first region and drain region; and forming a second region having the first conductivity type in the well region below the source region and first region;

wherein the oxide layer confines the minority carrier charge from the body diode to a depth of less than 20 micrometers from the surface of the lateral power semiconductor device.

2. The method of claim 1, wherein the substrate is an n-type or p-type handle wafer.

3. The method of claim 1, wherein the source region and drain region are made with n-type semiconductor material.

4. The method of claim 1, wherein the channel region and well region are made with p-type semiconductor material.

5. The method of claim 1, wherein the substrate is made with N+ or P+ semiconductor material.

6. A method of manufacturing a lateral power semiconductor device, consisting of:

forming a substrate;

forming an oxide layer over the substrate for reducing minority carrier storage in the substrate;

forming a silicon layer directly on the oxide layer;

forming a well region in the silicon layer;

forming a source region, drain region with a lightly doped drain (LDD) region, gate region, and channel region of the lateral power semiconductor device in the well region, the channel region being disposed below the gate region between the source region and LDD drain region, the source region and drain region with LDD drain region having a first conductivity type, the channel region and well region having a second conductivity type;

forming a first region having the second conductivity type on a surface of the lateral power semiconductor device adjacent to the source region, wherein a body diode is formed between the first region and drain region; and forming a second region having the second conductivity type in the well region below the source region and first region;

wherein the oxide layer confines the minority carrier charge from the body diode to a depth of less than 20 micrometers from the surface of the lateral power semiconductor device.

7. The method of claim 6, wherein the substrate is an n-type or p-type handle wafer.

8. The method of claim 6, wherein the source region and drain region are made with n-type semiconductor material.

9. The method of claim 6, wherein the channel region and well region are made with p-type semiconductor material.

* * * * *